United States Patent
Cho et al.

(10) Patent No.: US 9,564,233 B1
(45) Date of Patent: Feb. 7, 2017

(54) OPEN BLOCK SOURCE BIAS ADJUSTMENT FOR AN INCOMPLETELY PROGRAMMED BLOCK OF A NONVOLATILE STORAGE DEVICE

(71) Applicant: SanDisk Technologies, Inc., Plano, TX (US)

(72) Inventors: Hoon Cho, Sunnyvale, CA (US); Jun Wan, San Jose, CA (US); Yanjie Wang, Santa Clara, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 15/061,919

(22) Filed: Mar. 4, 2016

(51) Int. Cl.
G11C 11/34 (2006.01)
G11C 16/16 (2006.01)
G11C 16/26 (2006.01)
G11C 16/34 (2006.01)

(52) U.S. Cl.
CPC .............. *G11C 16/16* (2013.01); *G11C 16/26* (2013.01); *G11C 16/349* (2013.01); *G11C 16/3427* (2013.01); *G11C 16/3459* (2013.01)

(58) Field of Classification Search
USPC ............. 365/185, 2, 185.03, 185.09, 185.11, 365/185.17, 185.18, 185.22, 185.24, 365/185.29, 185.33
See application file for complete search history.

(56) References Cited

U.S. PATENT DOCUMENTS

| | | | | |
|---|---|---|---|---|
| 8,264,890 | B2* | 9/2012 | Mokhlesi ............ | G11C 11/5635 365/185.17 |
| 9,042,181 | B2* | 5/2015 | Flynn ..................... | G11C 16/14 365/185.18 |
| 9,098,399 | B2* | 8/2015 | Ellis ..................... | G06F 12/0246 |
| 9,236,133 | B2* | 1/2016 | Yanamanamanda ... | G11C 16/26 |
| 9,251,053 | B2* | 2/2016 | Hyun .................. | G06F 12/0238 |
| 9,431,116 | B2* | 8/2016 | Sun ......................... | G11C 16/10 |
| 2013/0051148 | A1* | 2/2013 | Lee .................... | G11C 16/3427 365/185.18 |
| 2015/0117107 | A1* | 4/2015 | Sun ........................ | G11C 16/10 365/185.18 |
| 2016/0172045 | A1* | 6/2016 | Shukla ............... | G11C 16/0483 365/185.11 |
| 2016/0217860 | A1* | 7/2016 | Lai ....................... | G11C 11/5628 |

* cited by examiner

*Primary Examiner* — Trong Phan
(74) *Attorney, Agent, or Firm* — Kunzler Law Group, PC

(57) ABSTRACT

Apparatuses, systems, methods, and computer program products are disclosed for adjusting a voltage level for a write operation on a partially programmed block of a nonvolatile storage device. A write module receives a request to perform a write operation for one or more storage cells of an partially programmed block of a nonvolatile storage device. A characteristic module determines whether a characteristic for a partially programmed block of a nonvolatile storage device satisfies a threshold. A voltage adjustment module adjusts a voltage level applied to one or more source lines connected to the one or more storage cells during a write operation in response to determining a characteristic satisfies a threshold.

20 Claims, 8 Drawing Sheets

US 9,564,233 B1

OPEN BLOCK SOURCE BIAS ADJUSTMENT FOR AN INCOMPLETELY PROGRAMMED BLOCK OF A NONVOLATILE STORAGE DEVICE

TECHNICAL FIELD

The present disclosure, in various embodiments, relates to writing data to a partially programmed block of a nonvolatile storage device and more particularly relates to adjusting a source line voltage level applied during a program operation.

BACKGROUND

Blocks of a nonvolatile storage device may include word lines that have not yet been programmed. Performing read operations on the word lines of the nonvolatile storage device that have already been programmed may cause read disturbances on the unprogrammed word lines, which may lead to errors in data later programmed to the unprogrammed word lines.

SUMMARY

Apparatuses are presented for adjusting a voltage level for a write operation on an incompletely programmed block of a nonvolatile storage device. In one embodiment, an apparatus includes a nonvolatile memory medium comprising word lines organized into a plurality of erase blocks. In certain embodiments, an apparatus includes a controller that verifies that a read count of a partially programmed erase block of a nonvolatile memory medium satisfies a threshold in response to a request to write data to one or more unprogrammed word lines of a partially programmed erase block. In a further embodiment, an apparatus includes a die controller that reduces, during programming of data to one or more unprogrammed word lines, a voltage level applied to one or more source lines coupled to memory cells of the one or more unprogrammed word lines from a voltage level that was previously applied to one or more programmed word lines of an erase block in response to verifying that a read count satisfies a threshold.

Methods are presented for adjusting a voltage level for a write operation on an incompletely programmed block of a nonvolatile storage device. In one embodiment, a method includes receiving a request to perform a write operation for one or more storage cells of a partially programmed block of a nonvolatile storage device. In another embodiment, a method includes determining whether a characteristic for a partially programmed block of a nonvolatile storage device satisfies a threshold. In a further embodiment, a method includes adjusting, during a write operation, a voltage level applied to a source line connected to one or more storage cells in response to determining a characteristic satisfies a threshold. Adjusting a voltage level, in certain embodiments, compensates for a read disturb effect caused by reading from a partially programmed block prior to a write operation.

An apparatus, in another embodiment, includes means for determining a read count and an age for an erase block comprising one or more word lines that have not been programmed. In a further embodiment, an apparatus includes means for comparing a read count and an age for an erase block to a threshold to determine whether the threshold is satisfied. An apparatus, in certain embodiments, includes means for setting a voltage level applied to one or more source lines during programming of one or more word lines.

In one embodiment, a voltage level is set lower than a default voltage level for one or more source lines in response to determining a threshold is satisfied.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which.

DETAILED DESCRIPTION

Figure 1A:
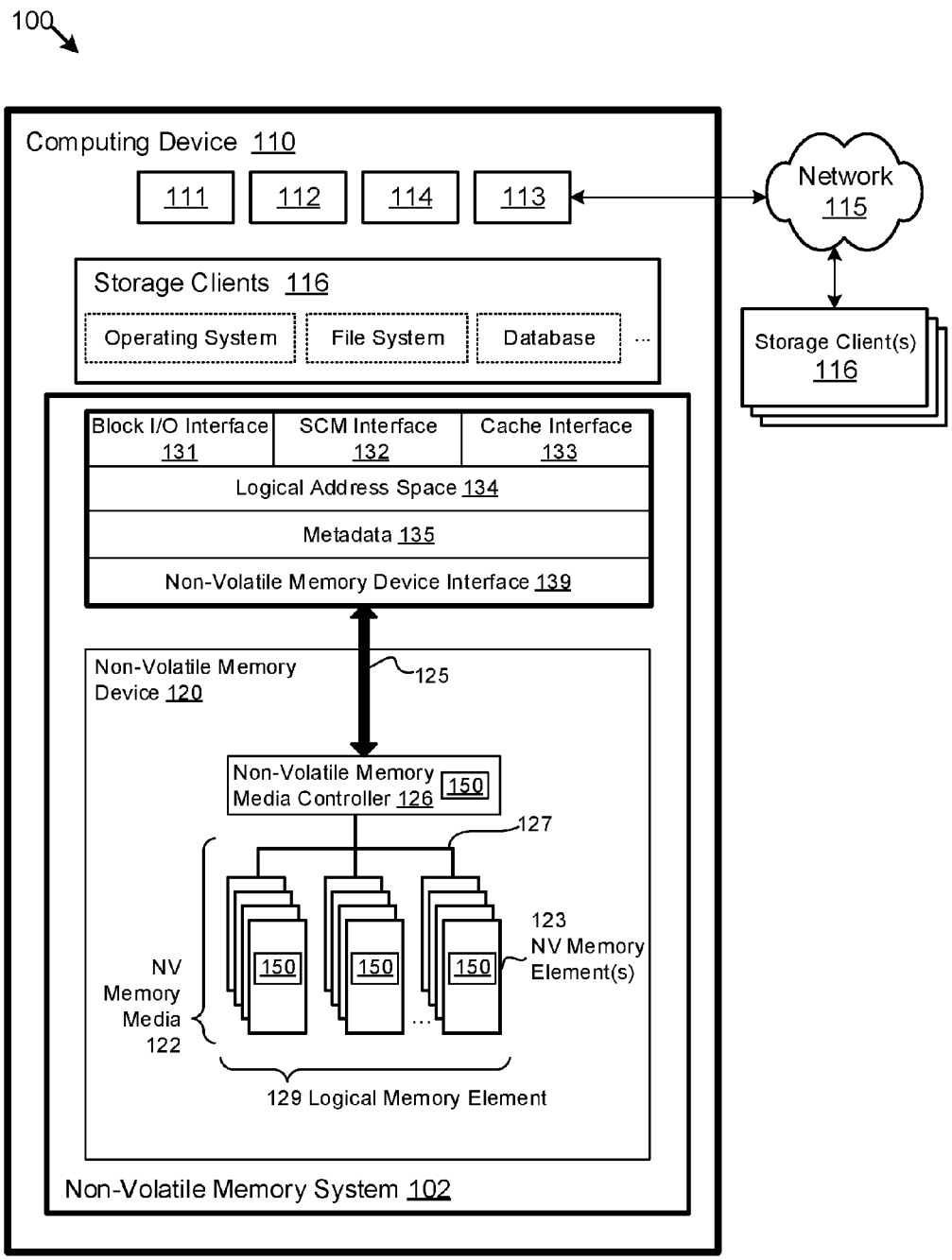
FIG. 1A is a schematic block diagram illustrating one embodiment of a system for adjusting a voltage level for a write operation on an incompletely programmed block of a nonvolatile storage device.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a voltage management module 150 for a non-volatile memory device 120. The voltage management module 150 may be part of and/or in communication with a non-volatile memory media controller 126, a non-volatile memory element 123, a device driver, or the like. The voltage management module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the voltage management module 150 may be embodied as one or more computer readable instructions stored on the non-transitory storage medium 114.

The non-volatile memory system 102, in the depicted embodiment, includes a voltage management module 150. The voltage management module 150, in one embodiment, is configured to adjust a voltage applied to a source line connected to one or more storage cells of an incompletely programmed block of a nonvolatile storage device 120 during a write operation in response to one or more characteristics of the incompletely programmed block satisfying a threshold. In certain embodiments, adjusting the source voltage during a write operation performed on one or more storage cells of an incompletely programmed block compensates for voltage discrepancies introduced on the unprogrammed storage cells due to read disturb, otherwise known as open block read disturb, which may cause nearby storage cells in the same block to change over time, e.g., become programmed. Accordingly, during a write operation performed on the unprogrammed storage cells, the voltage management module 150 may adjust the source voltage applied during the write operation to account for the side effects of an open block read disturb.

In one embodiment, the voltage management module 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the voltage management module 150 may comprise executable software code, such as a device driver or the like, stored on the computer readable storage medium 114 for execution on the processor 111. In a further embodiment, the voltage management module 150 may include a combination of both executable software code and logic hardware.

In one embodiment, the voltage management module 150 is configured to receive storage requests from a device driver or other executable application via a bus 125 or the like. The voltage management module 150 may be further configured to transfer data to/from a device driver and/or storage clients 116 via the bus 125. Accordingly, the voltage management module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the voltage management module 150 may receive storage requests as an API call from a storage client 116, as an IO-CTL command, or the like.

According to various embodiments, a non-volatile memory controller 126 in communication with one or more interface modules 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
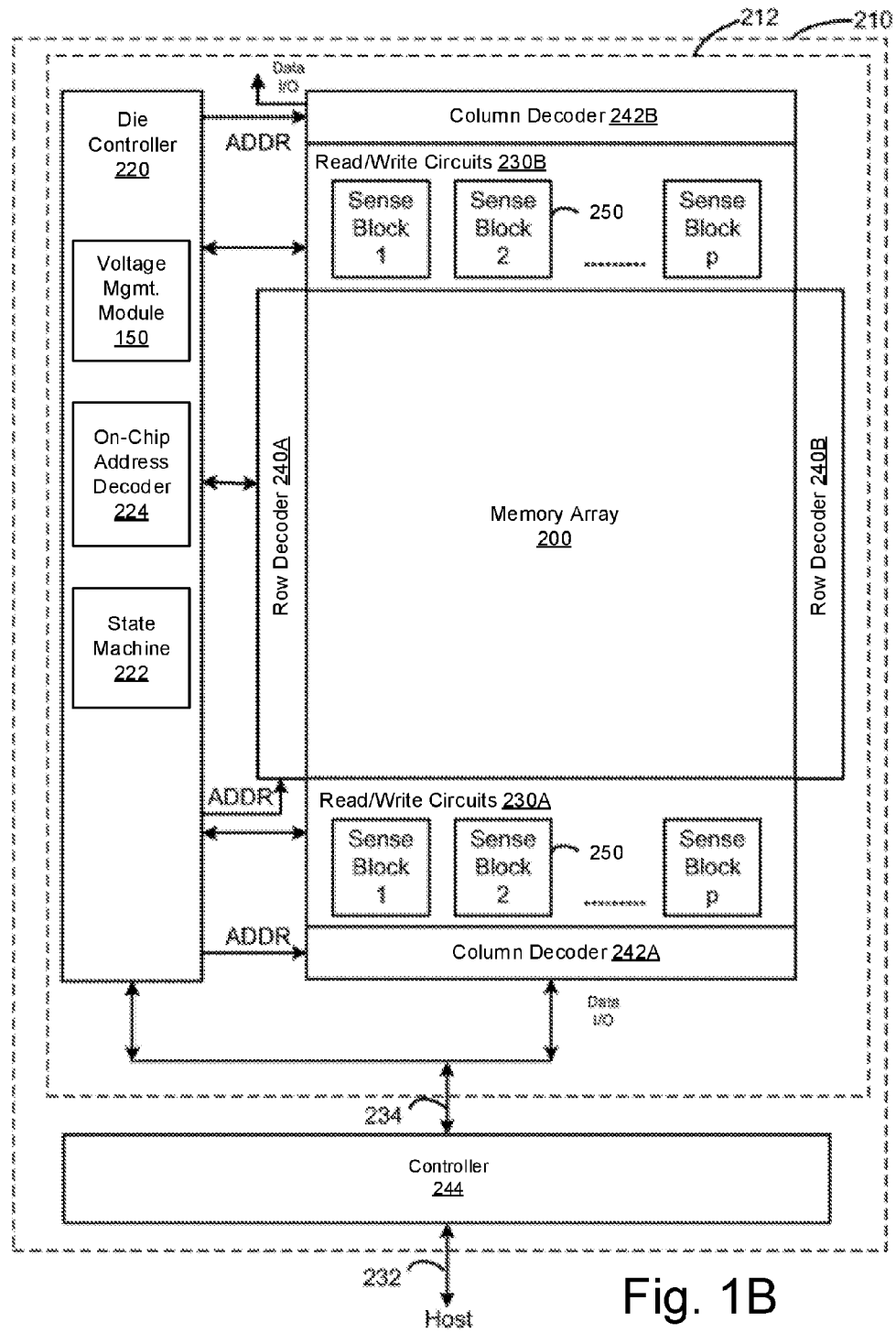
FIG. 1B is a schematic block diagram illustrating one embodiment of another system for adjusting a voltage level for a write operation on an incompletely programmed block of a nonvolatile storage device.

FIG. 1B illustrates an embodiment of a non-volatile storage device 210 that may include one or more memory die or chips 212. The nonvolatile storage device 210 may be substantially similar to the nonvolatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks (1 to p) 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines (Data I/O). One implementation can include multiple chips 212.

Die controller 220, in one embodiment, cooperates with the read/write circuits 230A/230B to perform memory operations on the memory array 200. The die controller 220, in certain embodiments, includes a voltage management module 150, a state machine 222, and an on-chip address decoder 224. The voltage management module 150, in one embodiment, is configured to adjust a voltage applied to a source line connected to one or more memory cells of an incompletely programmed memory array 200 of a memory die 212 during a write operation in response to one or more characteristics of the incompletely programmed memory array 200 satisfying a threshold.

The state machine 222, in one embodiment, provides chip-level control of memory operations. The on-chip address decoder 224 provides an address interface to convert between the address ADDR that is used by the host or a memory controller to the hardware address used by the decoders 240A, 240B, 242A, 242B. In certain embodiments, the state machine 222 includes an embodiment of the voltage management module 150. The voltage management module 150, in some embodiments, controls the power and voltages supplied to the word lines and bit lines during memory operations. In one embodiment, the voltage management module 150 includes one or more charge pumps that can create voltages larger than the supply voltage. The voltage management module 150, in certain embodiments, is embodied as software in a device driver, hardware in a device controller 244, and/or hardware in a die controller 220 and/or state machine 222.

In one embodiment, one or any combination of die controller 220, voltage management module 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2A:
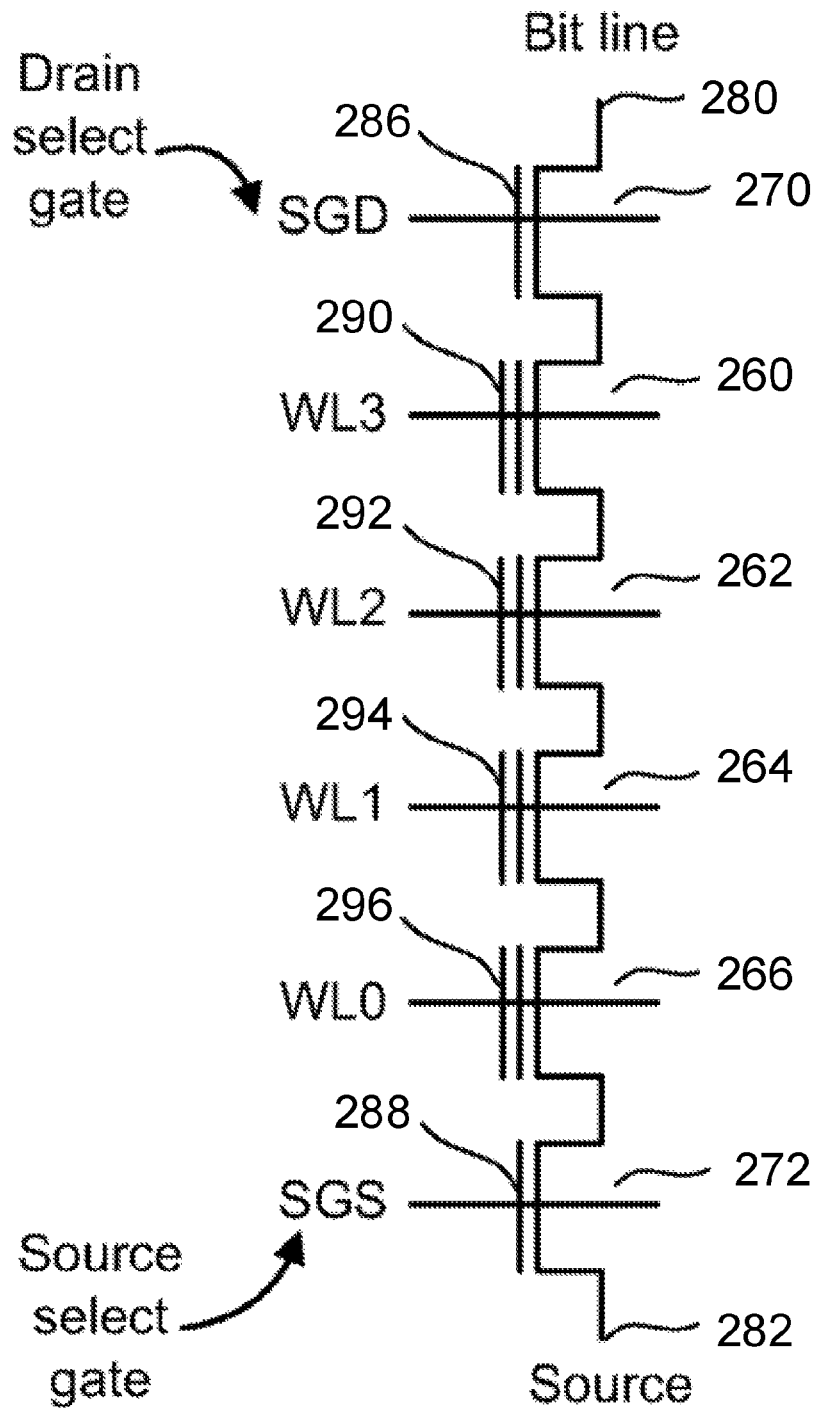
FIG. 2A is a schematic block diagram illustrating one embodiment of a string of storage cells.

FIG. 2A depicts one embodiment of a NAND string comprising a plurality of storage elements. The NAND string depicted in FIG. 2A, in some embodiments, includes four transistors 260, 262, 264, 266 connected in series and located between a first select gate 270 and a second select gate 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select gate 270, in some embodiments, gates/connects the NAND string connection to a bit line 280 via a drain select gate SGD. The second select gate 272, in certain embodiments, gates/connects the NAND string connection to a source line 282 via a source select gate SGS. The first select gate 270, in a further embodiment, is controlled by applying a voltage to a corresponding control gate 286. The second select gate 272, in some embodiments, is controlled by applying a voltage to corresponding control gate 288.

As shown in FIG. 2A, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the voltage management module 150 may bias or adjust a voltage level applied to the source line at the source gate during a write operation on an unprogrammed storage cell 260, 262, 264, 266 to compensate for read disturbs that may have occurred during read operations on a programmed storage cell 260, 262, 264, 266. The voltage management module 150, in some embodiments, determines how much to bias the voltage applied to the source line 282 based on one or more characteristics of the storage block/memory array 200 that the NAND string is part of, such as a read count for the storage block, an age of the non-volatile storage device 210 and/or the die 212 that the storage block is part of, a temperature of the device 210 and/or the die 212, and/or the like. In a further embodiment, the voltage management module 150 applies a corresponding bias voltage to the bit line 280 at the drain gate during a write operation in order to maintain a predefined voltage differential between the source 288 and drain 286 gates.

Figure 2B:
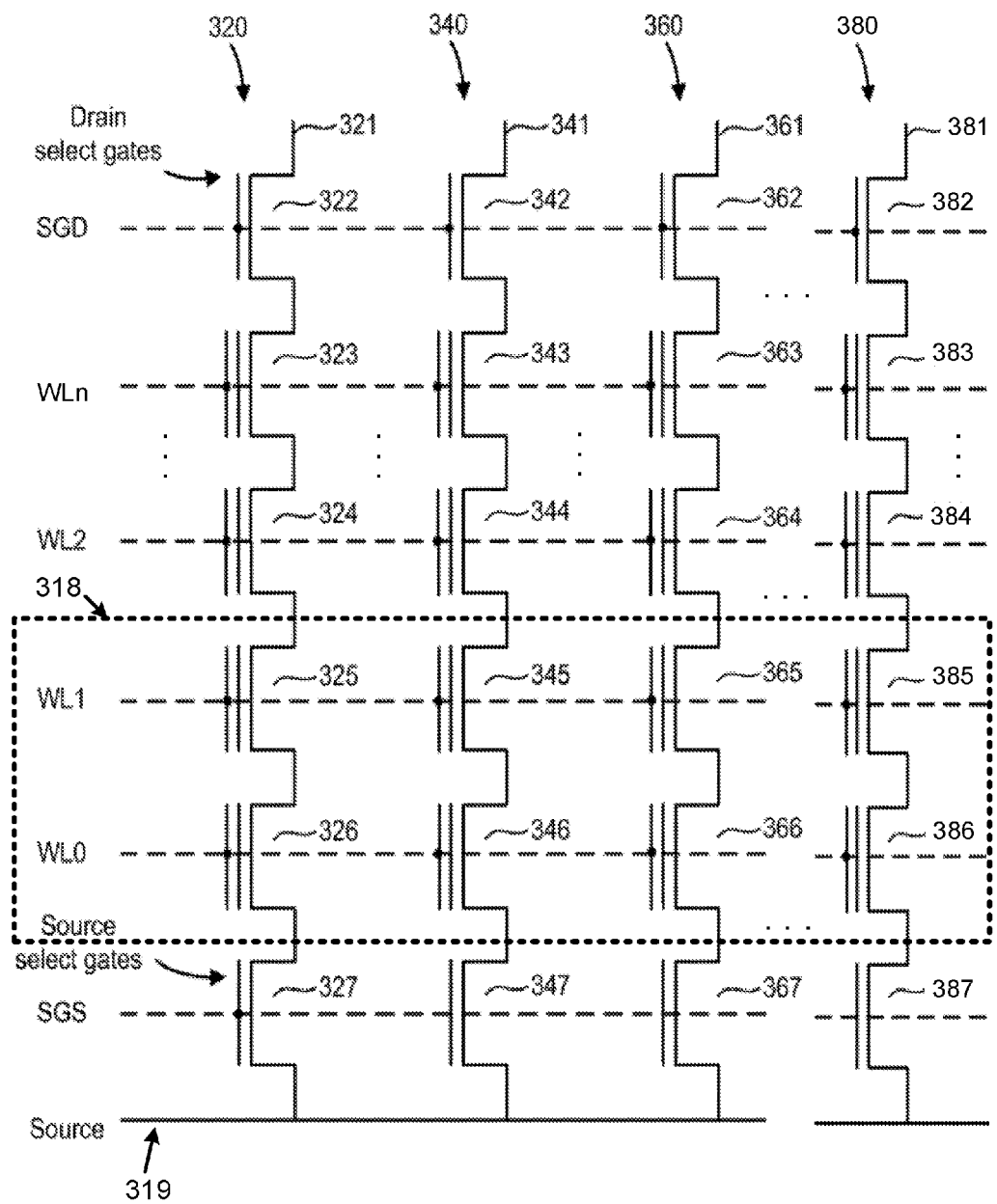
FIG. 2B is a schematic block diagram illustrating one embodiment of an array of storage cells.

FIG. 2B is a circuit diagram depicting a plurality of NAND strings 320, 340, 360, 380. An architecture for a flash memory system using a NAND structure may include several NAND strings 320, 340, 360, 380. For example, FIG. 2B illustrates NAND strings 320, 340, 360, 380 in a memory array 200 that includes multiple NAND strings 320, 340, 360, 380. In the depicted embodiment, each NAND string 320, 340, 360, 380 includes drain select gates 322, 342, 362, 382, source select gates 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements 100, 102, 104, 106, e.g., thirty-two, sixty-four, or the like storage elements 100, 102, 104, 106.

A NAND string 320, 340, 360, 380, in one embodiment, is connected to a source line 319 by a source select gate 327, 347, 367, 387. A selection line SGS may be used to control the source side select gates. The various NAND strings 320, 340, 360, 380, in one embodiment, are connected to bit lines 321, 341, 361, 381 by drain select gates 322, 342, 362, 382. The drain select gates 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, a storage element 323-326, 343-346, 363-366, 383-386 is configured to store data. For example, when storing one bit of digital data, the range of possible threshold voltages ("VTH") of the storage element 323-326, 343-346, 363-366, 383-386 may be divided into two ranges which are assigned logical data "1" and "0." In one example of a NAND type flash memory, the VTH may be negative after the storage element 323-326, 343-346, 363-366, 383-386 is erased, and defined as logic "1." In one embodiment, the VTH after a program operation is positive and defined as logic "0."

When the VTH is negative and a read is attempted, in some embodiments, a storage element 323-326, 343-346, 363-366, 383-386 will turn on to indicate logic "1" is being stored. When the VTH is positive and a read operation is attempted, in a further embodiment, a storage element will not turn on, which indicates that logic "0" is stored. A storage element 323-383, 324-384, 325-385, 326-386 may also store multiple levels of information, for example, multiple bits of digital data. In such an embodiment, the range of VTH value is divided into the number of levels of data. For example, if four levels of information can be stored in a storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage element 323-326, 343-346, 363-366, 383-386 and the threshold voltage ranges of the storage element 323-326, 343-346, 363-366, 383-386 depends upon the data encoding scheme adopted for the storage elements 323-326, 343-346, 363-366, 383-386.

In one embodiment, the erase block 200 may include one or more word lines WL0-WL1 318 that include storage elements 326-386, 325-385 that are programmed, while the remaining word lines WL2-WLn include storage elements 324-384, 323-383 that are unprogrammed. In such an embodiment, the erase block 200 may be considered a partially programmed block, an incompletely programmed block, a block comprising unprogrammed storage elements 324-384, 323-383, and/or the like. In some embodiments, when a read operation is performed on a programmed word line WL0-WL1 318, a read disturb, e.g., an open block read disturb, may occur on one or more storage elements 324-384, 323-383 of an unprogrammed word line WL2-WLn, which may cause unintended side-effects, as described below, such as generating a higher erase level on the unprogrammed storage elements 324-384, 323-383.

In such an embodiment, the voltage management module 150 adjusts a voltage applied to a source gate 327-387 of a source line 319 connected to one or more storage cells 323-326, 343-346, 363-366, 383-386 of an incompletely programmed block 200 of a nonvolatile storage device 120 during a write operation. In this manner, the voltage management module 150 generates a voltage level bias on the source line 319 that compensates or accounts for the higher erase level introduced on the unprogrammed storage elements 324-384, 323-383 by one or more read disturb occurrences as a result of one or more read operations performed on the word lines WL0-WL1 comprising programmed storage elements 325-385, 326-386.

In certain embodiments, as described in more detail below, the voltage management module 150 adjusts the voltage level applied to the source line 319 in response to one or more characteristics of the storage block 200 and/or the nonvolatile storage device 120 satisfying a threshold. For example, the voltage management module 150 may monitor, check, or otherwise determine a read count of the erase block 200, and, in response to the read count satisfying a predetermined read count threshold, may adjust the voltage level applied to the source line 319 during a write operation as a function of the read count. In this manner, the voltage management module 150 may improve the performance and endurance of a partially programmed block 200 of a nonvolatile storage device 120.

Figure 3:
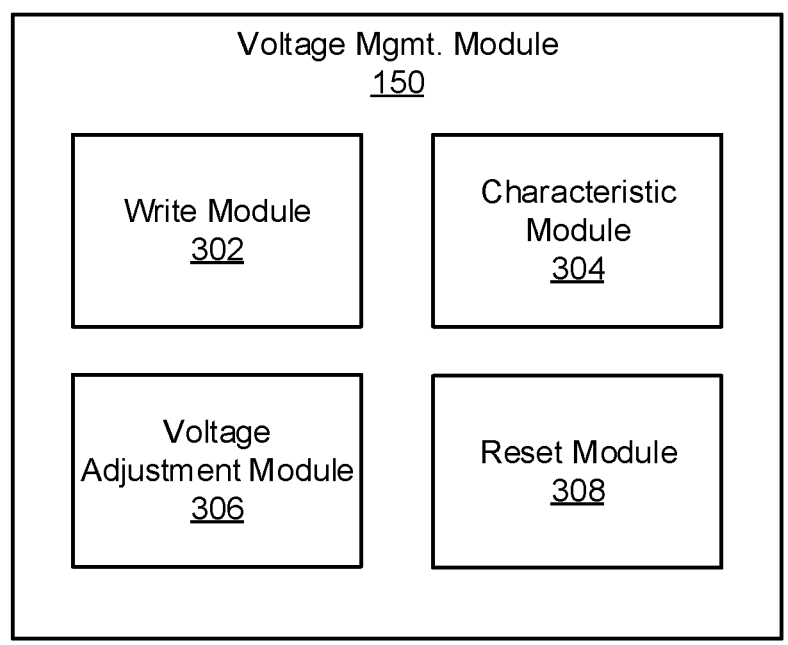
FIG. 3 is a schematic block diagram illustrating one embodiment of a module for adjusting a voltage level for a write operation on an incompletely programmed block of a nonvolatile storage device.

FIG. 3 depicts one embodiment of a voltage management module 150. The voltage management module 150 may be substantially similar to the voltage management module 150 described above with regard to FIG. 1. In general, as described above, the voltage management module 150 is configured to adjust a voltage applied to a source line connected to one or more storage cells of an incompletely programmed block of a nonvolatile storage device 120 during a write operation in response to one or more characteristics of the incompletely programmed block satisfying a threshold. In the depicted embodiment, the voltage management module 150 includes a write module 302, a characteristic module 304, a voltage adjustment module 306, and a reset module 308, which are described in more detail below.

The write module 302, in one embodiment, is configured to receive a request to perform a write operation for one or more storage cells of a block of a nonvolatile storage device 120. In one embodiment, the storage cells of the block may be substantially similar to the storage cells 323-326, 343-346, 363-366, 383-386 comprising the word lines W0-Wn of a memory array or erase block 200 described above with reference to FIG. 2B. The nonvolatile storage device 102, in one embodiment, includes storage cells that comprise one or more word lines of a storage block, which may comprise an erase block of NAND flash storage cells of a NAND flash memory device. The NAND flash memory device may be embodied as a two-dimensional NAND flash storage device, a three-dimensional NAND flash storage device, and/or the like.

The write module 302, in one embodiment, receives a request to perform a write operation from a controller 124, such as a die controller, a state machine, a local or networked client 116, and/or the like. The one or more storage cells, in certain embodiments, may include storage cells of an incompletely programmed block of a nonvolatile storage device 120. As used herein, an incompletely or partially programmed block of a nonvolatile storage device 120 (e.g., an open block) includes one or more storage cells (e.g., one or more word lines) that have already been programmed with data and one or more storage cells (e.g., one or more word lines) that have not yet been programmed with data since being erased, or the like.

For example, an incompletely or partially programmed block of a nonvolatile storage device 120 may be an erase block that includes some word lines that have been programmed, and includes other word lines that are unprogrammed. In some embodiments, read operations that are performed on programmed storage cells near or adjacent to unprogrammed storage cells may cause a read disturb that affects the unprogrammed storage cells (e.g., changes the charge level of the unprogrammed storage cells), which may ultimately have unintended side effects on the performance and endurance of the block and the nonvolatile storage device 120 (e.g., cause some of the unprogrammed storage cells to be under programmed, over programmed, or the like when they are programmed, increasing an error rate for the storage cells).

In certain embodiments, an open block read disturb may cause unprogrammed storage cells or word lines to have a higher erase level prior to programming. As a result, initially unprogrammed storage cells may have more fail bits after they are programmed in a write operation than the previously programmed storage cells in the block. Other negative side effects of an open block read disturb, in certain embodiments, may include shrinking a program/erase ("P/E") threshold voltage ("Vt") window as a result of the Vt distribution shifting down and the erase level shifting up, one or more hard errors due to lower page misreads, which may degrade error correction codes such as low-density error correcting codes, and/or unnecessary read retry operations that may degrade performance of the nonvolatile storage device 120 due to a mismatch in the optimum read level and the programmed/unprogrammed storage cells or word lines.

Therefore, adjusting the voltage applied to a source line, or a source gate of a source line, during a write operation on an unprogrammed storage cell or a word line affected by an open block read disturb may increase the Vt window during an upper page program and/or reduce hard error by increasing a read voltage ("VREAD") margin during a lower page read.

The characteristic module 304, in one embodiment, is configured to determine whether a characteristic for an incompletely programmed block of a nonvolatile storage device 120 satisfies a threshold. The characteristic, in some embodiments, is associated with the endurance of the nonvolatile storage device 120, the performance of the nonvolatile storage device 120, and/or the like. For example, the characteristic may include how many read operations have been performed on the block since the block was erased (e.g., the number of times a read disturb may have occurred on the block), an age of the nonvolatile storage device 120, which may be determined based on an error rate for the block and/or a P/E cycle count for the block, a temperature of the nonvolatile storage device 120, and/or the like.

The threshold may be a predetermined or predefined threshold value. In certain embodiments, the threshold is a dynamic or variable value that may change over time. The threshold may be a user-configurable value. The threshold, for example, as it relates to the characteristics of the nonvolatile storage device 120 that the characteristic module 304 determines, may comprise a threshold number of read operations performed on a block of the nonvolatile storage device 120 since the block was erased, a threshold bit error rate ("BER") for the nonvolatile storage device 120, a threshold P/E cycle count for the nonvolatile storage device 120, a threshold temperature of the nonvolatile storage device 120, and/or the like.

The voltage adjustment module 306, in one embodiment, is configured to adjust a voltage level applied to a source line, or source gates of a source line, connected to one or more storage cells during a write operation in response to determining a characteristic satisfies a threshold. In certain embodiments, the voltage adjustment module 306 decreases the voltage below a default voltage, a predetermined voltage, a predefined voltage, and/or the like that is used to perform a write operation. For example, in response to determining that a read disturb threshold for a partially programmed erase block has been satisfied, the voltage adjustment module 306 may decrease the voltage applied to a source line associated with one or more unprogrammed storage cells by 0.5 V. As discussed above, in this manner, the voltage management module 150 may compensate for the negative side effects on the unprogrammed storage cells caused by open block read disturbs.

In some embodiments, the voltage adjustment module 306 adjusts a voltage level applied to one or more drain lines, and/or one or more drain gates that correspond to the one or more source gates, with adjusted input voltages, and which are associated with one or more unprogrammed storage cells, during the write operation. In certain embodiments, the voltage adjustment module 306 adjusts the voltage level applied to the one or more drain gates by an amount that maintains a voltage differential between the drain gate and the corresponding source gate. As used herein, the voltage differential may be the difference in voltages between a source gate and a drain gate. For example, if a desired voltage differential between a source gate and a drain gate is 1.5 V, and the voltage adjustment module 306 decreases the voltage level applied to the source gate by 0.25 V, then the voltage adjustment module 306 may also decrease the voltage level applied to the drain gate by 0.25 V in order to maintain the 1.5 V voltage differential between the source and the drain gates.

In some embodiments, the voltage adjustment module 306 adjusts the voltage level applied to the source line by a factor that is determined based on the characteristic that satisfied the threshold. For example, based on the read count of the partially programmed erase block, the voltage adjustment module 306 may reduce the voltage applied to the source line during the write operation by 0.25 V, 0.5 V, 0.75 V, and so on. Thus, in the foregoing example, as the read count increases, the factor with which the voltage adjustment module 306 reduces the input voltage also increases to compensate for the larger number of open block read disturb occurrences on the partially programmed block.

In one embodiment, the voltage adjustment module 306 may calculate the adjustment factor based on one or more characteristics of the nonvolatile storage device 120, the partially programmed block, and/or the like. For example, the voltage adjustment module 306 may determine a factor to use to decrease the voltage level applied to the source line during a write operation based on a normalized multiple of the read count for the erase block and a bit error rate for the nonvolatile storage device 120. If the resulting normalized value is greater than 1, but less than 2, for example, then the voltage applied to the source line may be reduced by a factor of 1*0.25 V; if the resulting value is greater than 2, but less than 3, for example, then the voltage applied to the source line may be reduced by a factor of 2*0.25 V, and so on.

In one embodiment, the voltage adjustment module 306 adjusts the voltage level applied to a source line for the write operation in steps in response to multiple characteristics of the block and/or the nonvolatile storage device 120 satisfying a plurality of thresholds. For example, the voltage adjustment module 306 may first adjust the voltage level applied to a source line for the write operation in response to the read count for the partially programmed block satisfying a read count threshold. Thereafter, the voltage adjustment module 306 may additionally adjust the voltage level in response to the temperature of the nonvolatile storage device 120 satisfying a temperate threshold, and so on.

In certain embodiments, the voltage management module 150 adjusts the voltage level during a write operation, e.g., changes one or more parameters to adjust the voltage level, by system set-feature (e.g., in 1Z component, BiCS component, or the like), test-mode, and/or the like. In certain embodiments, changing parameters, e.g., adjusting a voltage level applied to a source line during a write operation, using a system set-feature is faster than using test-mode because less parameters may be adjusted at one time using a system set-feature than in the test mode. In certain embodiments, the voltage management module 150 uses the system set-feature to adjust the voltage level for an entire erase block.

In one embodiment, the reset module 308 is configured to reset the voltage level applied to the source line during the write operation to a default voltage level, a predetermined voltage level, a predefined voltage level, or the like for a write operation performed on the partially programmed block. For example, if the predetermined voltage level applied to the source line for a write operation is 1.5 V, and the voltage adjustment module 306 decreased the applied voltage level to 1.25 V during the write operation, thereafter the reset module 308 may increase or reset the voltage level to 1.5 V for subsequent write operations in response to the write operation being completed.

In a further embodiment, the reset module 308 is configured to reset a read count for the partially programmed block in response to the partially programmed block being erased. For example, the reset module 308 may reset the read count to zero in response to a block being erased. A read count of zero may indicate that no read operations have been performed on the erase block and, therefore, no occurrences of open block read disturb. Accordingly, in such an embodiment, the voltage adjustment module 306 may not need to calculate how much to adjust the voltage level applied to the block to perform a write request based on the read count of the block, and/or may not include the read count in its adjustment calculations.

In one embodiment, the write module 302 receives a subsequent request to perform a subsequent write operation for one or more storage cells of the incompletely programmed block that are different than the one or more storage cells programmed during a previous write operation. In certain embodiments, the characteristic module 304 determines whether a characteristic for the incompletely programmed block of the nonvolatile storage device 120 satisfies a different threshold. In a further embodiment, in response to determining the characteristic satisfies the different threshold, the voltage adjustment module 306 adjusts the voltage level applied to the source line of the source line by a different amount than a previous voltage level adjustment for the subsequent write operation.

For example, a block of a nonvolatile storage device 120 may comprise a plurality of programmed word lines and a plurality of unprogrammed word lines such that the block is partially programmed. The write module 302 may receive a first write request to perform a write operation on a first unprogrammed word line. The characteristic module 304 may determine a characteristic, such as a read count, of the block and/or a characteristic, such as a bit error rate, for the nonvolatile storage device 120, and compare the determined characteristic to a threshold value for the characteristic. In response to determining the characteristic satisfies the threshold value for the characteristic, the voltage adjustment module 306 may reduce the voltage applied to the source line connected to the storage elements of the first word line by a factor determined based on the characteristic satisfying the threshold.

Continuing with the above example, the write module 302 may receive a second write request, subsequent to the first write request, to perform a write operation on a second unprogrammed word line. The characteristic module 304 may again determine a characteristic for the block and/or the nonvolatile storage device 120, and may determine whether the characteristic satisfies a threshold for the characteristic, which may be a different threshold than the threshold used for the first write operation. The voltage adjustment module 306 may decrease the voltage applied to the source line connected to the storage elements of the second word line by a different factor determined based on the characteristic satisfying the different threshold. In this manner, changes between write operations performed on the partially programmed block, such as read disturb occurrences, temperature changes, bit error rate variations, and/or the like, may be dynamically accounted for during each write operation.

Figure 4A:
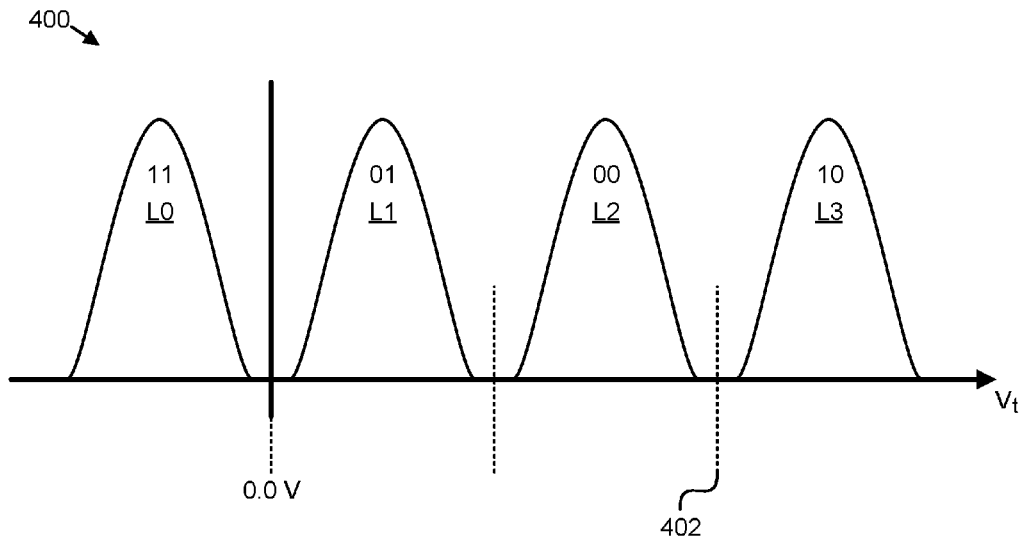
FIG. 4A is a graph illustrating one embodiment of a distribution of stored read voltage values for cells of a non-volatile memory medium.

FIG. 4A depicts a graph 400 of a distribution of stored read voltage values for cells of a non-volatile memory medium 120. In the depicted embodiment, the non-volatile memory medium 120 is an MLC flash memory medium in which each cell has four states, but various types of memory and numbers of states per cell may be used in other embodiments. In the depicted embodiment, the data-encoding physical value of each cell is the stored read voltage of the cell. Data is stored in each cell by changing the amount of stored charge in the floating gate, which determines the stored read voltage for the cell and within which abode or state (e.g., the depicted L0, L1, L2, and L3 abodes) the stored read voltage falls. In some embodiments, FIG. 4A depicts an initial programming distribution of the storage cells of an incompletely programmed block of a nonvolatile storage device 120.

In the depicted embodiment, hard read voltage thresholds 402 (e.g., Vt) divide the range of possible stored read voltage values for a cell into states L0, L1, L2, and L3, where L0 is the erased state. A threshold voltage 402 (e.g., Vt) is applied to the control gate of the cell, and if the applied threshold voltage 402 is sufficient to make the channel of the floating gate transistor conductive, the stored read voltage for the cell is above the applied threshold voltage 402. If the stored read voltage for a cell is below the first hard read threshold voltage 402, the cell is in the L0 state. If the stored read voltage for a cell is above the first hard read threshold voltage 402 but below the second hard read threshold voltage 402, the cell is in the L1 state, and so on. In some embodiments, the erased state L0 may correspond to a negative stored read voltage.

In one embodiment, an encoding maps states onto data values. For example, in the depicted embodiment, a Gray code encoding maps the four states L0, L1, L2, and L3 to the data values "11," "01," "00," and "10," respectively, so that the cell stores two bits of information. Cells of non-volatile memory media may store data using many other encodings.

The graph 400 depicts the distribution of stored read voltage values for a set of cells, representing the number of cells storing each possible stored read voltage value occurring for the set of cells, a random selection from the set of cells, or the like. The graph 400 depicts a uniform distribution among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution may be substantially uniform among states L0-L3, it is depicted as forming a bell-shaped peak in each state. In some embodiments, a cell may be programmed by issuing voltage pulses that move a stored read voltage level for the cell to or near a target voltage in the middle of the range of voltages that defines the state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the stored read voltage of cells move from their originally programmed values. In the depicted embodiment, the peaks do not significantly overlap the boundaries between states, indicating that cells are not likely to move into adjacent states. Therefore, hard read thresholds 402 may be sufficient to determine what data value was originally written to a cell, based on the cell's current state.

Figure 4B:
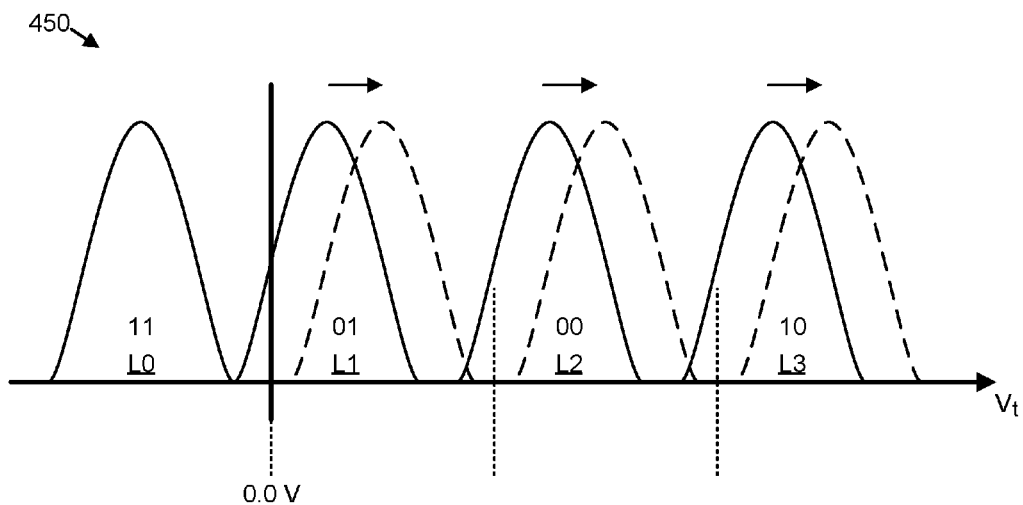
FIG. 4B is a graph illustrating another embodiment of a distribution of stored read voltage values for cells of a non-volatile memory medium.

FIG. 4B depicts a graph 450 of another distribution of stored read voltage values for the same set of cells as FIG. 4A. The same boundaries define states L0, L1, L2, and L3, encoding data values "11," "01," "00," and "10," respectively, as described above. However, the peaks representing the L1, L2, and L3 states have been shifted to the left. In one embodiment, the peaks representing the L1, L2, and L3 states may be shifted to the left due to open block read disturb occurrences on a partially programmed block. In response to one or more read operations being performed on programmed storage elements of an erase block, the stored read voltage levels for each state, L1, L2, and L3, have shifted to the left to extend over the read voltage thresholds 402.

In certain embodiments described herein, read operations performed on a partially programmed block of a nonvolatile storage device 120 may generate open block read disturb occurrences on the unprogrammed storage cells of the nonvolatile storage device 120. Accordingly, this may cause the Vt window for each state L0-L3 to shrink due to a distribution of Vt downward (e.g., to the left) while causing Vt erase levels to shift up. Furthermore, ECC correction codes, such as low-density error correcting codes, may be degraded over time as a result of hard error due to lower page misreads. Furthermore, in addition to degradation of the Vt margin associated with each state L0-L3, an open block read disturb may cause more read retries due to a mismatch in the optimum Vt read level between unprogrammed and programmed word lines.

To account for the shift in read voltage levels (e.g., stored charge) due to open block read disturb occurrences on a partially programmed block, the voltage management module 150 adjusts a voltage level applied to a source line during a write operation on a word line comprising unprogrammed storage cells. The voltage management module 150 may adjust the voltage level applied to the source line during a write operation based on a characteristic of a block or nonvolatile storage device 120 satisfying a threshold. Furthermore, the amount that the voltage management module 150 adjusts the voltage level may be determined as a factor of the characteristic, e.g., based on the read count for the partially programmed block. In this manner, the voltage management module 150 attempts to shift the voltage read thresholds for each state L1, L2, L3, to the right and back to the initial programming distribution.

Figure 5:
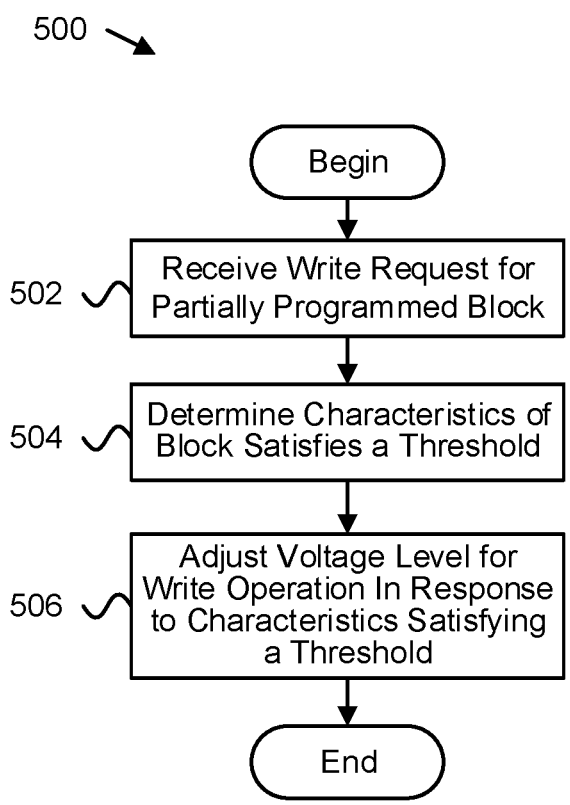
FIG. 5 is a schematic flow chart diagram illustrating one embodiment of a method for adjusting a voltage level for a write operation on an incompletely programmed block of a nonvolatile storage device.

FIG. 5 depicts one embodiment of a method 500 for adjusting a voltage level for a write operation on an incompletely programmed block of a nonvolatile storage device 120. In one embodiment, the method 500 begins and a write module 302 receives 502 a write request to perform a write operation for one or more storage cells of an incompletely programmed block of a nonvolatile storage device 120. In some embodiments, a characteristic module 304 determines 504 whether a characteristic for the incompletely programmed block of the nonvolatile storage device 120 satisfies a threshold. In some embodiments, the characteristic includes a read count for the partially programmed block, an age of the nonvolatile storage device 120, which may be determined according to a bit error rate of the nonvolatile storage device 120, a P/E cycle count for the nonvolatile storage device 120, and/or the like, a temperature of the nonvolatile storage device 120, and/or the like.

In a further embodiment, the voltage adjustment module 306 adjusts 506 a voltage level applied to a source line, and/or one or more source gates of a source line, connected to one or more storage cells of an unprogrammed word line during the write operation in response to determining that the characteristic satisfies the threshold. For example, the voltage adjustment module 306 may decrease the voltage level applied for the write operation below a predetermined voltage level applied for write operations, and the method 500 ends.

Figure 6:
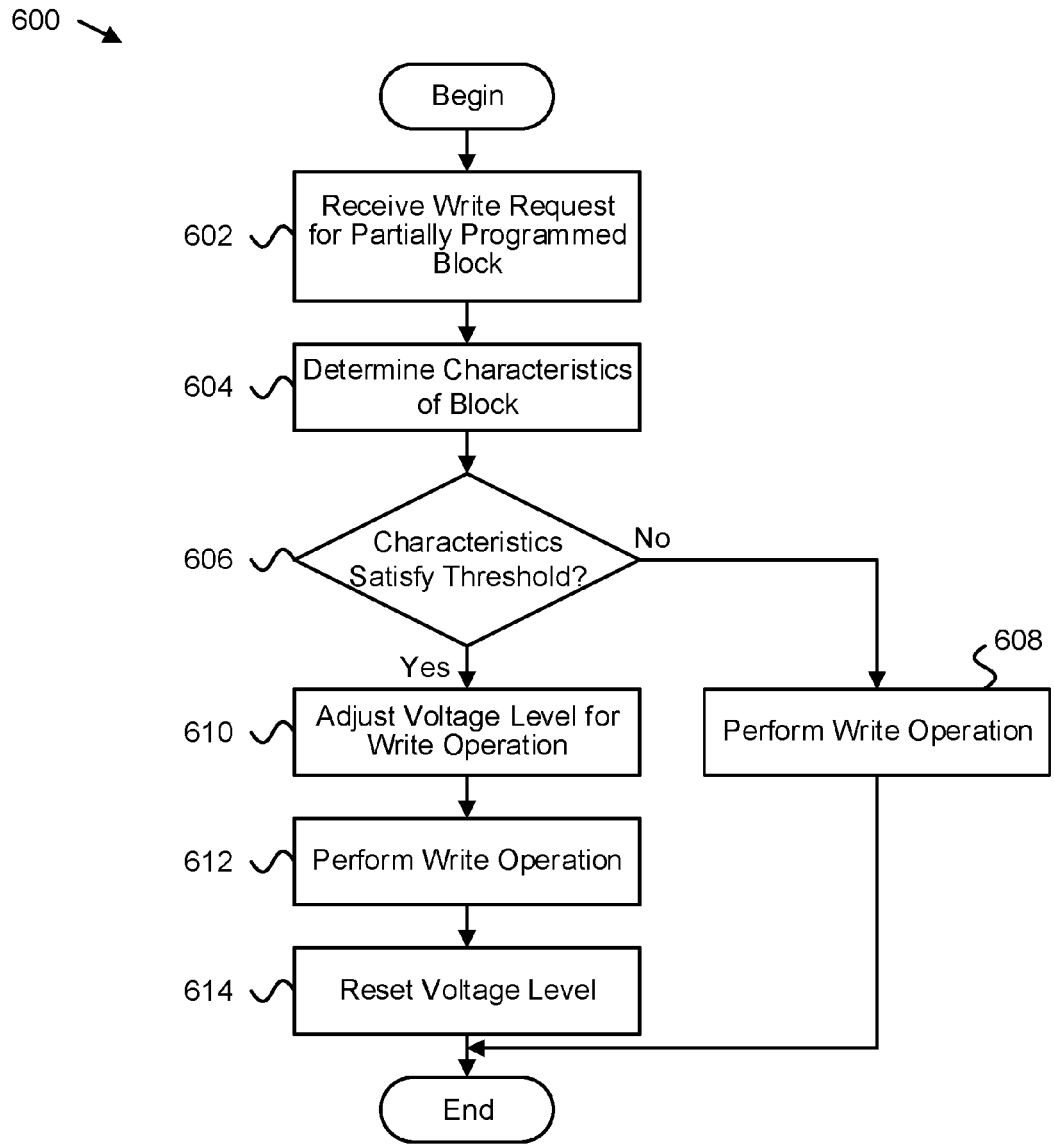
FIG. 6 is a schematic flow chart diagram illustrating one embodiment of another method for adjusting a voltage level for a write operation on an incompletely programmed block of a nonvolatile storage device.

FIG. 6 depicts one embodiment of a method 600 for adjusting a voltage level for a write operation on an incompletely programmed block of a nonvolatile storage device 120. In one embodiment, the method 600 begins and the write module 302 receives 602 a write request to perform a write operation for one or more storage cells of an incompletely programmed block of a nonvolatile storage device 120. In a further embodiment, the characteristic module 304 determines 604 one or more characteristics of the partially programmed block and/or the nonvolatile storage device 120.

In some embodiments, the characteristic module 304 determines 606 whether the one or more characteristics of the partially programmed block and/or the nonvolatile storage device 120 satisfies a threshold. If not, the write module 302, in certain embodiments, performs 608 the write operation using a predetermined voltage level applied to a source line, and/or one or more source gates of a source line, connected to the one or more storage cells, and the method 600 ends.

In some embodiments, the characteristic module 304 determines 606 whether the characteristics satisfy a threshold in response to performing one or more calculations using values associated with the characteristics. For example, the characteristic module 304 may determine 604 a read count value for the partially programmed block and a bit error rate or P/E cycle count for the nonvolatile storage device 120. Based on the determined values, the characteristic module 304 may multiply the read count by the bit error rate and/or P/E cycle count (e.g., RC*BER, RC*P/E, or the like) and normalize the result (e.g., divide by a predetermined value) to determine a value to compare against the threshold value.

The voltage adjustment module 306, in one embodiment, adjusts 610 the voltage level applied to the source line for the write operation in response to the characteristics satisfying the threshold. In some embodiments, the voltage adjustment module 306 adjusts the voltage level to be lower than a predetermined voltage level for write operations. For example, the predetermined voltage level that is applied to a source line for write operations may be 1.5 V, and the voltage adjustment module 306 may adjust the voltage level to be less than 1.5 V to compensate for open block read disturb occurrences on the unprogrammed storage cells of the block. In certain embodiments, the voltage adjustment module 306 adjusts the voltage level of a drain line associated with a drain gate that corresponds to a source gate by the same amount to maintain a voltage differential between the source gate and the drain gate.

In some embodiments, the voltage adjustment module 306 adjusts the voltage level by a factor determined based on a calculated value determined as a function of the characteristics, as described above. For example, if the normalized result of the read count ("RC") multiplied by the bit error rate ("BER") (e.g., (RC*BER)/α, where α is a predetermined normalization factor) is greater than or equal to 1, but less than 2, then the voltage adjustment module 306 may adjust the voltage by 1 times a voltage adjustment factor (e.g., predetermined write operation voltage level—1*0.25 V); if the normalized result is greater than or equal to 2, but less than 3, then the voltage adjustment module 306 may adjust the voltage by 2 times a voltage adjustment factor (e.g., predetermined write operation voltage level—2*0.25 V); and so on.

In some embodiments, the voltage adjustment module 306 adjusts 610 the voltage level by an additional amount based on a temperature of the nonvolatile storage device 120. For example, if the temperature of the nonvolatile storage device 120 is less than a threshold temperature, the voltage adjustment module 306 may decrease the voltage applied to the source line for the write operation by an additional amount to compensate for the temperature of the nonvolatile storage device 120.

In certain embodiments, the write module 302 performs 612 the write operation using the adjusted voltage level as the voltage applied to the source line for the write operation. In some embodiments, after the write operation is complete, the reset module 308 resets 614 the voltage level for the write operation to a predetermined voltage level, a predefined voltage level, a default voltage level, or the like that is used for write operations, and the method 600 ends.

A means for receiving a request to perform a write operation for one or more storage cells of an incompletely programmed block of a nonvolatile storage device 120, in various embodiments, may include a write module 302, a voltage management module 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for receiving a request to perform a write operation for one or more storage cells of an incompletely programmed block of a nonvolatile storage device 120.

A means for determining a read count and an age for an erase block comprising one or more word lines that have not been programmed, in various embodiments, may include a characteristic module 304, a voltage management module 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for determining a read count and an age for an erase block comprising one or more word lines that have not been programmed.

A means for comparing the read count and the age to a threshold to determine whether the threshold is satisfied, in various embodiments, may include a characteristic module 304, a voltage management module 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for comparing the read count and the age to a threshold to determine whether the threshold is satisfied.

A means for setting a voltage level applied to a source line during programming of the one or more word lines, in various embodiments, may include a voltage adjustment module 302, a voltage management module 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for setting a voltage level applied to a source line during programming of the one or more word lines.

A means for resetting the voltage level to a default voltage level for a source line in response to completing the write operation, in various embodiments, may include a reset module 308, a voltage management module 150, a processor, a die controller, a die state machine, a non-volatile memory controller, a non-volatile memory media controller, a device driver, other logic hardware, and/or other executable code stored on a computer readable storage medium. Other embodiments may include similar or equivalent means for resetting the voltage level to a default voltage level for a source line in response to completing the write operation.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:
1. An apparatus comprising:
   a nonvolatile memory medium comprising word lines organized into a plurality of erase blocks; and
   a controller configured to:
      verify that a read count of a partially programmed erase block of the nonvolatile memory medium satisfies a threshold in response to a request to write data to one or more unprogrammed word lines of the partially programmed erase block; and
      reduce, during programming of the data to the one or more unprogrammed word lines, a voltage level applied to one or more source lines coupled to memory cells of the one or more unprogrammed word lines from a voltage level that was applied to one or more previously programmed word lines of the erase block in response to verifying that the read count satisfies the threshold.
2. The apparatus of claim 1, wherein the controller reduces a voltage level applied to one or more drain lines coupled to the memory cells of the one or more unprogrammed word lines that correspond to the one or more source lines, the controller reducing the voltage level applied to the drains by a same amount as the reduction of the voltage level applied to the one or more source lines.
3. The apparatus of claim 1, wherein the controller resets the voltage level back to the same voltage level applied to the one or more previously programmed word lines of the erase block in response to the data being programmed to the one or more unprogrammed word lines of the erase block.
4. The apparatus of claim 1, wherein the read count satisfying the threshold is also a function of an age for the partially programmed erase block, the age comprising one or more of an error rate and a program/erase cycle count.
5. The apparatus of claim 1, wherein the controller's adjustment of the voltage level includes an additional adjustment based on a temperature associated with the nonvolatile memory medium.
6. The apparatus of claim 1, wherein the controller comprises a die controller on the same semiconductor chip as the nonvolatile memory medium.
7. The apparatus of claim 1, wherein the controller comprises a hardware storage controller for the non-volatile memory medium in communication with a plurality of semiconductor chips of non-volatile memory, one of the semiconductor chips comprising the non-volatile memory medium.
8. The apparatus of claim 1, wherein the controller comprises a device driver for a non-volatile memory device comprising the non-volatile memory medium, the device driver comprising executable code stored on one or more non-transitory computer readable storage media.
9. A method comprising:
   receiving a request to perform a write operation for one or more storage cells of a partially programmed block of a nonvolatile storage device;
   determining whether a characteristic for the partially programmed block of the nonvolatile storage device satisfies a threshold; and
   adjusting, during the write operation, a voltage level applied to a source line connected to the one or more storage cells in response to determining the characteristic satisfies the threshold thereby compensating for a read disturb effect caused by reading from the partially programmed block prior to the write operation.
10. The method of claim 9, wherein adjusting the voltage level comprises decreasing the voltage level below a predefined voltage level for the source line during the write operation.
11. The method of claim 10, wherein the voltage level is decreased by a factor determined based on the characteristic.
12. The method of claim 9, further comprising resetting the voltage level to the predefined voltage level for the source line in response to completing the write operation.
13. The method of claim 9, further comprising adjusting a voltage level applied to a drain line connected to the one or more storage cells during the write operation by a same amount as the adjustment to the voltage level applied to the source line to maintain a same voltage differential between the source line and the drain line during the write operation.
14. The method of claim 9, further comprising:
   receiving a subsequent request to perform a subsequent write operation for one or more different storage cells of the partially programmed block;
   determining whether the characteristic for the partially programmed block of the nonvolatile storage device satisfies a different threshold; and
   adjusting, by a different amount, a voltage level applied to a source line connected to the one or more different storage cells during the subsequent write operation in response to determining the characteristic satisfies the different threshold.
15. The method of claim 9, wherein the characteristic comprises a read count for the block of the nonvolatile storage device since the block was erased, the voltage level being adjusted by a factor determined based on the read count.
16. The method of claim 15, further comprising resetting the read count for the block in response to erasing the block of the non-volatile storage device.
17. The method of claim 9, wherein the characteristic comprises an age for the block, the age comprising one or more of an error rate for the block and a program/erase cycle count for the block.
18. The method of claim 9, wherein the adjustment of the voltage level includes an additional adjustment determined based on a temperature for the nonvolatile storage device.
19. The method of claim 9, wherein the one or more storage cells comprise a word line of storage cells of the block, the block comprising an erase block of NAND flash storage cells.

20. An apparatus comprising:
- means for determining a read count and an age for an erase block comprising one or more word lines that have not been programmed;
- means for comparing the read count and the age to a threshold to determine whether the threshold is satisfied; and
- means for setting a voltage level applied to one or more source lines during programming of the one or more word lines, the voltage level set lower than a default voltage level for the one or more source lines in response to determining the threshold is satisfied.

* * * * *